United States Patent [19]

Kawano

[11] Patent Number: 6,107,870
[45] Date of Patent: Aug. 22, 2000

[54] AUTOMATIC COMPENSATION CIRCUIT FOR AUTOMATICALLY COMPENSATING TIME CONSTANT OF FILTER

[75] Inventor: Mitsumo Kawano, Yokosuka, Japan

[73] Assignee: Kabushiki Kaisha Toshiba, Kawasaki, Japan

[21] Appl. No.: 09/173,178

[22] Filed: Oct. 15, 1998

[30] Foreign Application Priority Data

Oct. 16, 1997 [JP] Japan .................................. 9-283677

[51] Int. Cl.$^7$ ...................................................... H03K 5/00
[52] U.S. Cl. ........................... 327/553; 327/362; 327/552
[58] Field of Search ..................................... 327/555, 553, 327/362

[56] References Cited

U.S. PATENT DOCUMENTS

| | | | |
|---|---|---|---|
| 4,818,903 | 4/1989 | Kawano | 327/553 |
| 5,942,935 | 8/1999 | Okanobu | 327/553 |

FOREIGN PATENT DOCUMENTS

63-26111  2/1988  Japan .

*Primary Examiner*—Dinh T. Le
*Attorney, Agent, or Firm*—Oblon, Spivak, McClelland, Maier & Neustadt, P.C.

[57] ABSTRACT

A filter circuit having a first variable resistive element determining the time constant of the filter circuit and a band pass filter having a second variable resistive element determining the time constant of the band pass filter. Each variable resistive element is connected to receive a time constant control signal which is obtained through a compensation circuit which receives an output voltage signal from a phase detection circuit for detecting a phase difference between the output signal of the band pass filter and a reference signal. The compensation circuit has a comparison circuit for comparing a first voltage generated by a third variable resistive element and a second voltage generated by a constant trimming resistor to generate the output voltage signal. The resistive values of the first to third variable resistive elements vary in proportion to each other, thereby controlling the time constant of the filter circuit to be free from the influence of the variance of the resistive element of the filter circuit.

13 Claims, 4 Drawing Sheets

AUTOMATIC COMPENSATION CIRCUIT FOR AUTOMATICALLY COMPENSATING TIME CONSTANT OF FILTER

BACKGROUND OF THE INVENTION

This invention relates to an automatic compensation circuit for automatically compensating a time constant of a filter, in particular, an automatic compensation circuit for automatically compensating a time constant of a filter used as an active filter or the like.

Conventionally, an integrated circuit constituted of inductor, capacitor, and the like, has been often used as a filter for an electronic circuit. In response to the request for downsizing of a circuit with the progress of the integration technique, an active filter has been developed in recent years such that a filter can be contained in an integrated circuit.

In many cases, the active filter contained in an IC is formed to have a variable transconductance in order to compensate the variance of qualities of the elements in the filter. The active filter is constituted of a voltage-current conversion section the gain of which is determined by an inner resistance value and a Gilbert cell section capable of changing a gain with use of a current ratio. By controlling the current ratio, the variance of resistance value and capacitance value of the resistive elements and capacitive elements in the filter can be compensated.

Figure 1:
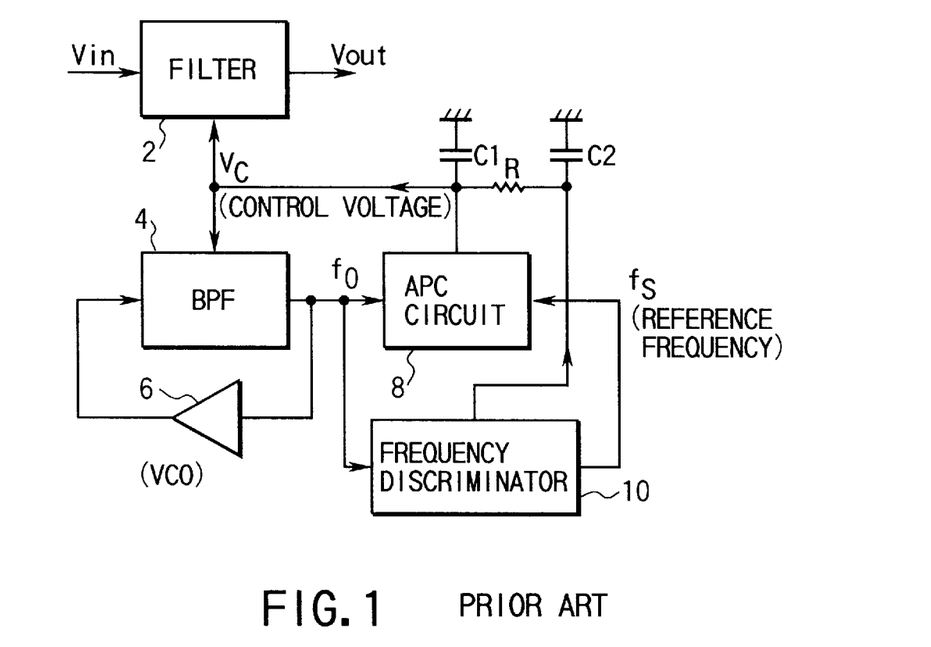
FIG. 1 is a block diagram showing the constitution of a compensation circuit for the conventional active filter.

FIG. 1 is a block diagram showing the constitution of a compensation circuit for compensating the conventional active filter.

In this diagram, a filter 2 having a center frequency $f_0$ is connected to a band pass filter (BPF) 4 having a variable time constant and a center frequency $f_0$. The time constants of these filters can be changed by a control voltage Vc. The output $f_0$ of the band pass filter 4 is fed back to an input terminal of the band pass filter 4 through an amplitude-limiting circuit 6, and then supplied to an APC circuit (phase detector circuit) 8.

The APC circuit 8 compares the input frequency signal $f_0$ with a reference frequency $f_s$ with use of a feedback loop to generate a voltage signal corresponding to the phase difference therebetween. The generated voltage signal is supplied as the control voltage Vc to the band pass filter 4 and the filter 2.

The filter 2 and the band pass filter 4 are connected to a resistor R and capacitors C1 and C2, which are provided to supply the control voltage Vc to the band pass filter 4 and the filter 2. The APC circuit 8 is connected to a frequency discriminator 10.

With such a constitution, when the output signal of the band pass filter 4 is fed back by the amplitude-limiting circuit 6 such that the input signal and the output signal of the band pass filter 4 have the same phase, the band pass filter 4 functions as an oscillator having an oscillation frequency $f_o$. When the oscillation frequency $f_o$ is fed back as the control voltage Vc to the band pass filter 4 (through the APC circuit), a feedback loop for setting the frequency as $f_o = f_s$ is obtained.

In this time, if the filter 2 having the same constitution as that of the band pass filter 4 is also controlled with use of the control voltage Vc, a predetermined relationship can be obtained between the time constant of the filter 2 and the reference frequency signal $f_s$, and the time constant is automatically compensated by the reference frequency signal $f_s$.

As should be clear from the above, this circuit functions as a PLL (Phase-Locked Loop), and the band pass filter 4 and the amplitude-limitting circuit 6 function as a VCO (voltage-controlled oscillator). With this constitution, the frequency characteristics of the filter can be compensated by locking the phase with use of the PLL such that the cut-off frequency $f_o$ of the VCO is set to be equal to the reference frequency $f_s$.

In such a kind of filter, the time constant is generally determined by a resistance value and a capacitance value. These elements for determining the time constant, however, cannot be formed to have sufficient precision in an IC. In order to improve the precision of the time constant, the currents or the like supplied to the elements are set to be variable.

Figure 2:
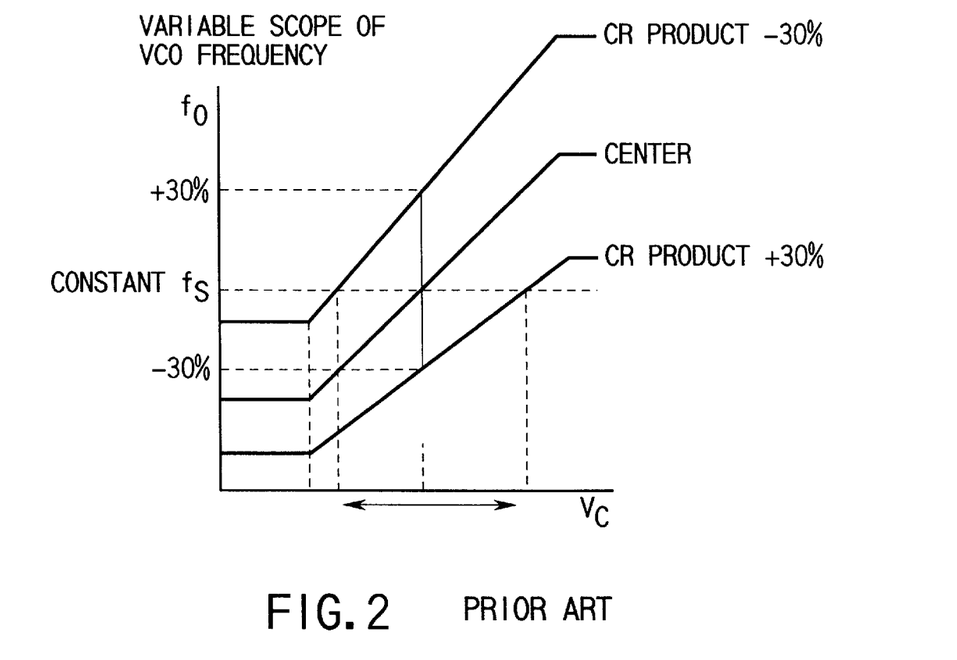
FIG. 2 shows a variable scope of a VCO frequency in the conventional compensation circuit shown in FIG. 1.

However, the variance of the resistance and capacitance values is so large that the time constant compensation amount will also increase. In order to cover such a large compensation amount, the variable scope of the gain also must be set wide. The scope of the gain must be set to obtain the relationship $f_{min} < f_s < f_{max}$ so that the scope constantly covers a predetermined reference frequency $f_s$ however wide the resistance and capacitance values are varied. The resistance value is generally varied within an error of ±20% and the capacitance value is varied within an error of ±10% when a variable scope is set within ±30% with regard to the reference frequency $f_s$ as shown in FIG. 2. The oscillation frequency $f_o$ of the VCO thus must have a variable scope covering an error as large as ±30% or more, with allowance.

As described above, the variable scope of the gain is too wide, and thus the dynamic range for the control is made too small. In order to compensate the dynamic range, the conventional filter needs to be provided with a frequency discriminator 10. The frequency discriminator 10 sets the oscillation frequency $f_o$ of the VCO within a scope such that such a scope as $f_0 = f_s \pm 10\%$ is obtained, thereby the PLL locks the phase.

Further, such a PLL comprising the VCO as an oscillator needs to be provided with a frequency limitter, otherwise the PLL does not lock the phase.

BRIEF SUMMARY OF THE INVENTION

The object of the present invention is to provide an IC an automatic time constant compensation circuit which can automatically compensate a time constant of a filter in the IC without being affected by the influence of the variance of resistance and capacitance values of the filter, and thus does not need not to be provided with a frequency discriminator.

The above-mentioned object of the present invention is attained by a filter time constant automatic compensation circuit for automatically compensating a time constant of a filter, which can be compensated in response to an external control signal, comprising: a band pass filter having a variable time constant and the same constitution as that of the filter; a feedback amplifier section for performing positive feedback to supply an output signal of the band pass filter to an input terminal of the band pass filter so as to oscillate the output signal of the band pass filter; a phase detector circuit for comparing the oscillation output of the band pass filter with a reference frequency signal, and generating a control signal corresponding to a phase difference therebetween; and a compensation circuit for compensating the control signal obtained by the phase detector circuit, wherein the time constant of the band pass filter is controlled with use of the control signal compensated by the compensation circuit, and the time constant of the filter is compensated with use of the control signal compensated by the compensation circuit.

Another object of the present invention is attained by a filter time constant automatic compensation circuit for automatically compensating a time constant of a filter, which can be compensated in response to an external control signal, comprising: a band pass filter having a variable time constant and the same constitution as that of the filter, the band pass filter being supplied with a reference frequency signal thereto, a phase detector circuit for receiving an output of the band pass filter to compare it with the reference frequency signal, and generating a control signal corresponding to a phase difference therebetween; and a compensation circuit for compensating the control signal obtained by the phase detector circuit, wherein the time constant of the band pass filter is controlled with use of the control signal compensated by the compensation circuit, and the time constant of the filter is compensated with use of the control signal compensated by the compensation circuit.

Still another object of the present invention is attained by a time constant variable circuit comprising: a filter capable of compensating a time constant thereof in response to an external control signal; a band pass filter having a variable time constant and the same constitution as that of the filter; a phase detector circuit for comparing an output of the band pass filter with the reference frequency signal, and generating a control signal corresponding to a phase difference therebetween; and a compensation circuit for compensating the control signal obtained by the phase detector circuit, wherein the time constant of the band pass filter is controlled with use of the control signal compensated by the compensation circuit, and the time constant of the filter is compensated with use of the control signal compensated by the compensation circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the present invention will be described below with reference to the drawings.

Figure 3:
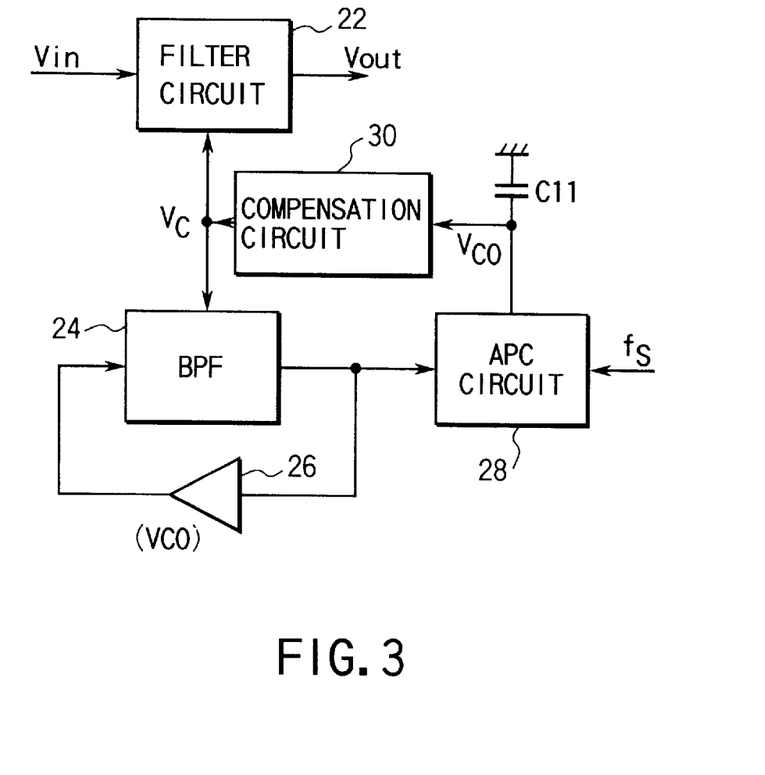
FIG. 3 is a block diagram showing the constitution of an automatic time constant compensation circuit contained in an active filter, according to the first embodiment of the present invention.

FIG. 3 is a block diagram showing an automatic time constant compensation circuit contained in an active filter, according to the first embodiment of the present invention.

In this drawing, a filter 22 is constituted to have a center frequency $f_0$. The filter 22 is connected to a band pass filter (BPF) 24 having a variable time constant as the center frequency $f_0$. The time constants of these filters can be set to be variable by a control voltage Vc. The output $f_0$ of the band pass filter 24 is fed back to the input terminal of the band pass filter 24 via an amplitude-limiting circuit 26 and supplied to an APC circuit (phase detector circuit) 28.

The APC circuit 14 compares an input frequency signal $f_0$ and a reference frequency $f_s$ with use of a feedback loop to generate a voltage signal corresponding to the phase difference therebetween. The generated voltage signal is supplied as a control voltage Vc to the band pass filter 24 and the filter 22.

The APC circuit 28 is connected to the filter 22 and the band pass filter 24 via a compensation circuit 30 which is also connected to capacitor C11. The compensation circuit 30 comprises a trimmer resistor a resistance value of which is trimmed in a manufacturing process of the IC such that the product of the resistance and the capacitance is set within a predetermined scope.

Figure 4:
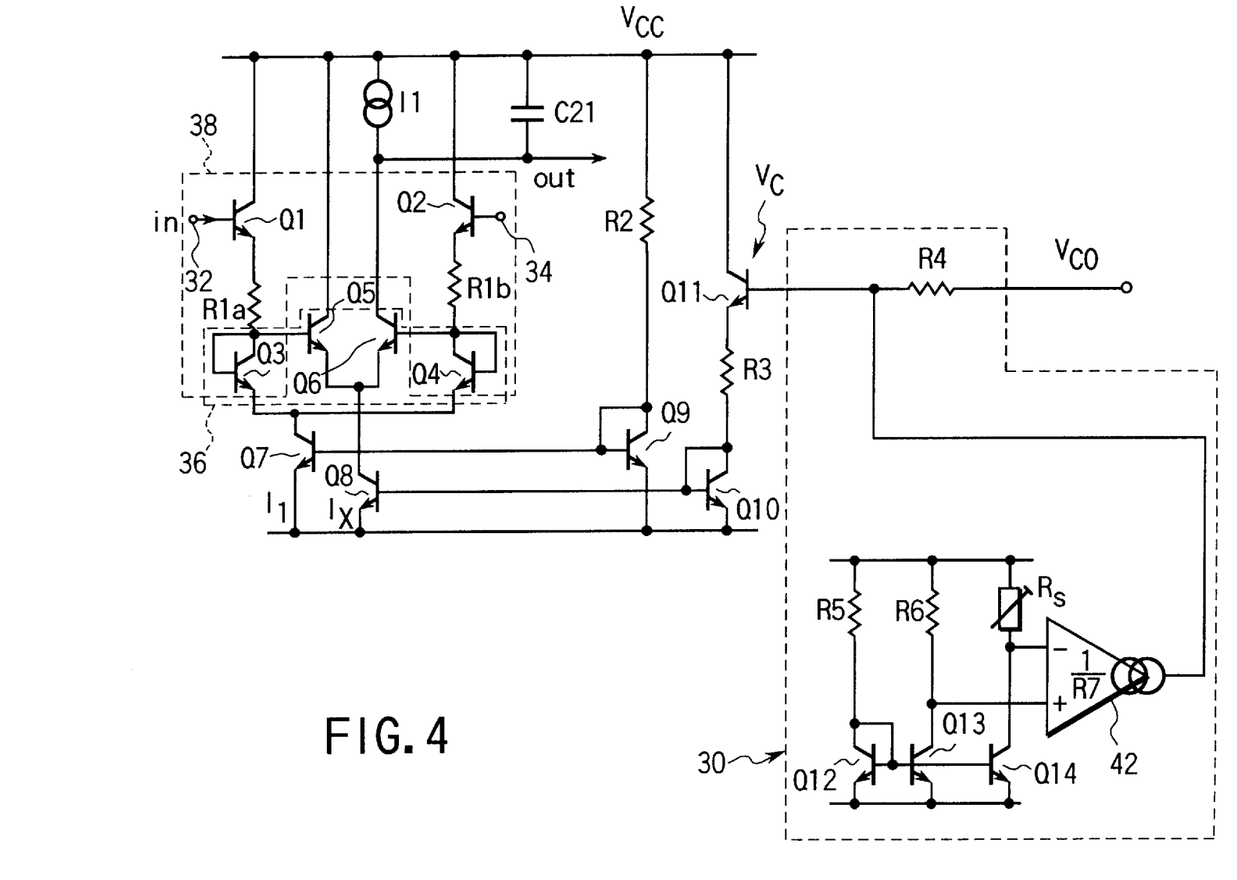
FIG. 4 schematically shows the constitution of a variable transconductor in order to explain the present invention.

FIG. 4 is a circuit diagram showing the constitution of the compensation circuit of an active filter, which uses a so-called Gilbert cell as the most effective as variable time constant compensation means.

Input terminals 32 and 34 applied with differential voltages V1 and V2 are respectively connected to bases of transistors Q1 and Q2, which constitute a differential pair. The transistor Q1 has a collector connected to a power supply line Vcc, and an emitter connected via a resistor R1$a$ to collector and base of a transistor Q3 having diode connection and connected to a base of a transistor Q5. The transistor Q2 has a collector connected to the power supply line Vcc, and an emitter connected via a resistor R1$b$ to a collector and a base of a transistor Q4 having diode connection and connected to a base of a transistor Q6.

The emitters of the transistors Q3 and Q4 are connected to a reference potential line (a ground line) in common via a transistor Q7. Similarly, the emitters of the transistors Q5 and Q6 are also connected to the ground line in common via a transistor Q8. The collector of the transistor Q5 is connected to the power supply line Vcc. The collector of the transistor Q6 is connected via a current source $I_1$ to the power supply line Vcc, and extends as an output terminal (not shown) via a capacitor C21.

Between the power supply line Vcc and the reference potential line, a transistor Q9 having a base connected to a base of the transistor Q7 is arranged such that a resistor R2 positioned between Vcc and the transistor Q9. A transistor Q10 having a base connected to the base of the transistor Q8 is connected to the power supply line Vcc and the ground line via an output transistor Q11 and a resistor R3. The transistors Q7–Q10 are provided to change the gain of the output.

The transistors Q3 and Q4 constitute a current control section 36. The transistors Q1–Q4 and the resistors R1$a$ and R1$b$ constitute a voltage-current conversion section 38.

The compensation circuit 30 shown in the right side of the drawing is constituted of a resistor R4, a resistor R5 and a transistor Q12 which constitute a current mirror circuit, a resistor R6, a transistor Q13, a trimmer resistor Rs, a transistor Q14, and a comparator 42. 1/R7 equals the conductance of a capacitor 42.

With the constitution having the above-mentioned compensation circuit, $f_0$ as the output of the band pass filter 24 is fed back to the input terminal of the band pass filter via an amplitude-limiting circuit 26, and then supplied to the APC circuit 28. The APC circuit 28 compares the input frequency signal $f_0$ and the reference frequency $f_s$ with use of a feedback loop. By this comparison, a voltage signal corresponding to the phase difference therebetween is generated to be supplied as a control voltage Vc to the band pass filter 24 and the filter 22.

More specifically, the band pass filter 24 functions as an oscillator having the oscillation frequency $f_0$ when the amplitude-limiting circuit 26 performs the feedback such that the input and output signals of the band pass filter have the same phase. By feeding the oscillation frequency $f_0$ as the control voltage Vc back to the band pass filter 24, a feedback loop for obtaining $f_0 = f_s$ is obtained.

At the same time, the filter 22 having the same constitution as that of the band pass filter 24 can be also controlled by the control voltage Vc, thereby a predetermined relationship can be attained between the time constant of the filter 22 and the reference frequency signal $f_s$. In this manner, the time constant of the filter 22 can be automatically compensated.

The compensation circuit 30 is provided in manufacturing the IC with a trimmer resistor Rs resistance value of which is trimmed such that the product of the resistance and the capacitance is set within a predetermined scope. The trimmer resistor Rs in the compensation circuit 30 changes its own resistance value by changing connection points of a plurality of patterning wires formed therein in advance. Accordingly, if the CR product is deviated from a desired value in the manufacturing process of the IC, the deviation is corrected by changing the connection of the pattern with use of the trimmer resistor Rs.

The compensation circuit 30 detects the difference ($\Delta V$) between the resistance value of a resistor constituting the filter and the resistance value of the trimmer resistor Rs as a reference value, and the control voltage Vc of the filter 22 is compensated by the difference $\Delta V$. More specifically, the comparator 42 detects the difference between the resistance value of the trimmer resistor Rs and the resistance value of the resistor R6. If the relationship Rs=R6 is attained in this time, there is no difference between the values, of course, and the compensation circuit 30 outputs no signal to compensate the control voltage Vc of the filter 22.

By adjusting the resistance value in this manner, the CR product seems to be set within a predetermined scope of the trimming precision with reference to an apparent control voltage Vco.

The time constant $\tau$ of the voltage-current conversion circuit is calculated as represented by a formula (1):

$$\tau = \frac{C}{gm} \approx 2R1C \frac{I_X}{I_1} \quad (1)$$

$$= 2R1C \cdot \frac{V_C - 2V_J}{V_{CC} - V_J} \cdot \frac{R2}{R3}$$

When the value of the control voltage Vc is fixed, the time constant $\tau$ changes in substantially proportional to R1C. In the formula (1), gm represents transconductance, $I_I$ and $I_X$ respectively represent an input current and an output current, and $V_J$ represents a junction voltage.

$\Delta V$ and Vc can be represented as shown below.

$$\Delta V = (V_{CC} - V_J)(R6 - Rs)/R5,$$

$$Vc = V_{CC} - (R4/R7)\Delta V$$

On the basis of these formulas, the relationship R4/R7=A is attained. By use of these formulas, the time constant can be obtained as represented below by a formula (2):

$$\tau = 2R1C \cdot \frac{R2}{R3} \cdot \frac{\left\{V_{C0} - 2V_J - (V_{CC} - V_J)\frac{R6}{R5}A\right\} + (V_{CC} - V_J)\frac{R_S}{R_5}A}{V_{CC} - V_J} \quad (2)$$

When the formula (2) is rewritten as represented below in a formula (3), the time constant $\tau$ is attained in the manner as represented below by a formula (4).

$$A \approx \frac{R_5}{R_6} \cdot \frac{V_{C0} - 2V_J}{V_{CC} - V_J} \quad (3)$$

$$\tau = 2R_S C \cdot \frac{R1 \cdot R2}{R3 \cdot R5} A \quad (4)$$

As should be clear from the formula (4), the time constant $\tau$ is proportional to the value of RsC, and thus is substantially constant.

As described above, the resistance value of the resistor to be selected is compensated by the a trimmer resistor Rs in the capacitance circuit as a reference value for compensating the variance of the CR product such that the CR product is set within a predetermined scope in the manufacturing process of the IC. The trimmer resistor Rs can also compensate the variance of the capacitance value. The resistance value of the other resistors constituting the filter are set in accordance with a pattern.

Accordingly, by detecting the difference between the resistance value of the trimmer resistor Rs having high precision and the resistance value of the resistor used in the filter 22, the control voltage Vc of the filter 22 can be compensated by the difference therebetween. By compensating the control voltage Vc of the filter 22 in this manner, the variance of the resistance and capacitance values of the elements in the filter can be automatically compensated.

If the trimmed resistor has high precision in fact, the compensation of the filter can be attained by using only the compensation circuit 30. However, the precision of the trimmed resistor has an error of ±7%. Accordingly, in order to improve the precision of the filter, a compensation loop needs to be provided, inevitably. The frequency discriminator as provided in the conventional circuit, however, does not need to be provided according to the present invention, even if the compensation loop is constituted of a PLL circuit.

Figure 5:
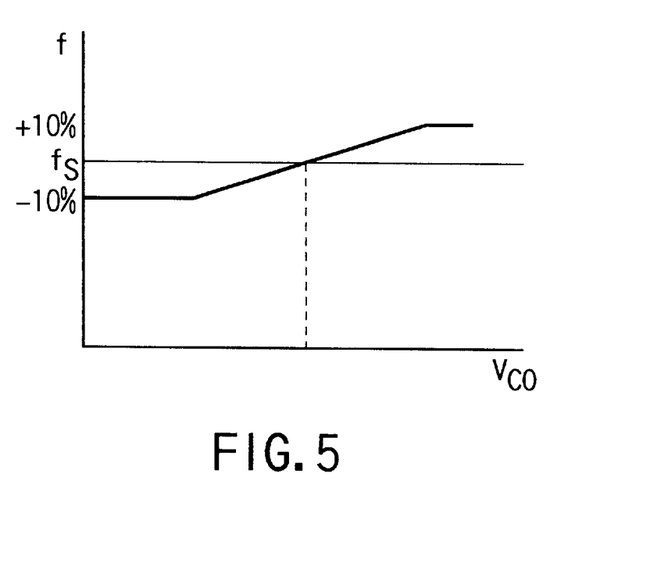
FIG. 5 shows a variable scope of the VCO frequency according to the first embodiment of the present invention.

FIG. 5 is a graph showing the variable scope of the VCO frequency of the present embodiment.

As shown in the graph, the variation of the VCO frequency according to the present invention is ranged within a scope of ±10% from the center frequency $f_s$. The scope of the variation may be set small as described above, and thus the control sensitivity can be set at a low level. The influence of noise can be thus decreased, resulting that the PLL can be easily designed.

As described above, by providing the circuit for detecting the difference between a resistor having such a high precision (in an IC, a trimmer resistor or the like) and the resistor for determining the voltage-current conversion gain, and the circuit for compensating the current ratio of the conventional Gilbert cell section by the difference between the resistors, the variance of the gain of the filter can be suppressed. In this manner, the CR product is maintained at a constant value by the trimmer resistor and the filter can be automatically compensated thereby.

According to the present invention, the variance of the absolute value of the gain of the filter will become remarkably small even if the trimmer resistor does not have a high precision, and the variable scope required for the compensation needs not to be set wide. The filter can be thus easily designed.

Further, when the present invention is applied to the oscillator of the PLL, any frequency limiter or the like does not need to be provided to the circuit.

Next, the second embodiment of the present invention will be described below.

Figure 6:
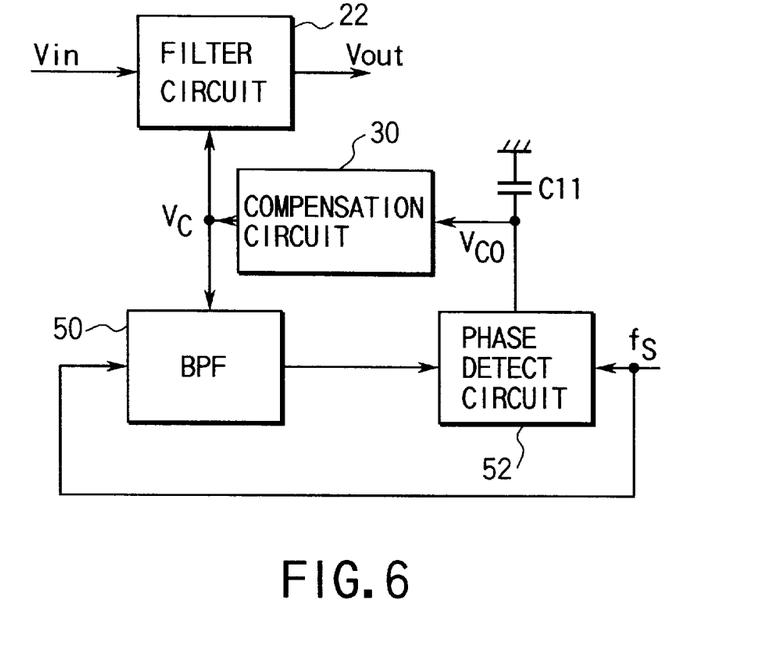
FIG. 6 is a block diagram showing the constitution of an automatic time constant compensation circuit contained in an active filter according to the second embodiment of the present invention.

FIG. 6 is a block diagram showing the constitution of a time constant variable circuit, according to the second embodiment of the present invention.

In the diagram of FIG. 6, a filter 22 having the center frequency $f_0$ is connected to a band pass filter (BPF) 50 having a center frequency $f_0$ and a variable time constant. The time constants of the filters are made to be variable by a control voltage Vc. The output of the band pass filter 50 is supplied to a phase detector circuit 52.

The phase detector circuit 52 is supplied with a reference frequency $f_s$ and a signal corresponding to the frequency $f_s$ the phase of which is shifted by the band pass filter 50. The phase detector circuit 52 compares these signals, and outputs a signal corresponding to the phase difference therebetween to a compensation circuit 30. The voltage signal compensated by the compensation circuit 30 is supplied as a control voltage Vc to the band pass filter 50 and the filter 22.

With this constitution, the feedback is performed to set the phase of the output of the band pass filter 50 and that of the reference signal $f_S$ equal to each other, and the center frequency of the band pass filter 50 is automatically adjusted to satisfy the relationship $f_o=f_s$.

In the circuit shown in FIG. 6, the precision and the detection gain must be higher than the phase detector circuit 52 in comparing with the circuit shown in FIG. 3. The compensation circuit 30 will suppress the variance of the resistance value and the capacitance value in the filter, and thus the precision and the detection gain may not be so strictly required in the phase detector circuit 52.

Figure 7:
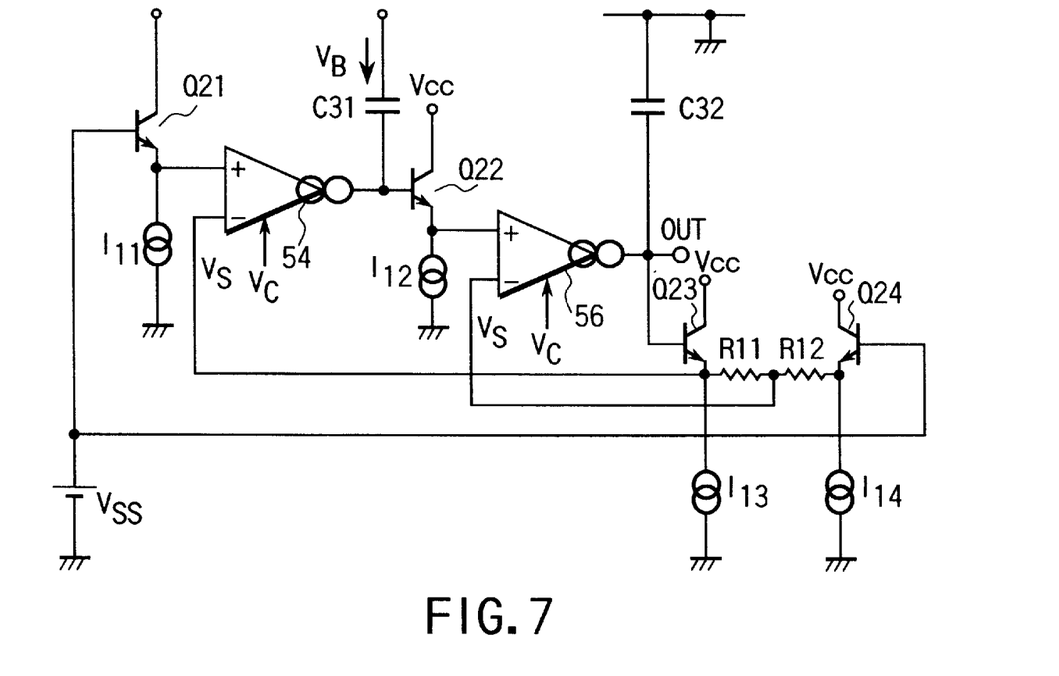
FIG. 7 schematically shows the constitution of an example of a band pass filter in order to explain the present invention.

FIG. 7 is a circuit diagram showing an example of the constitution of the band pass filter 50 in the time constant variable circuit.

In the circuit diagram of FIG. 7, comparators 54 and 56 have the same constitution as that of the circuit shown in FIG. 4 except for the compensation circuit 30, as will be described below more specifically.

Input terminals 32 and 34 applied with differential voltages V1 and V2 are respectively connected to bases of transistors Q1 and Q2, which constitute a differential pair. The transistor Q1 has a collector connected to a power supply line Vcc, and an emitter connected via a resistor R1a to collector and base of a transistor Q3 having a diode connection and connected to a base of a transistor Q5. The transistor Q2 has a collector connected to the power supply line Vcc, and an emitter connected via a resistor R1b to a collector and a base of a transistor Q4 having a diode connection and connected to a base of a transistor Q6.

The emitters of the transistors Q3 and Q4 are connected to a reference potential line (a ground line) in common via a transistor Q7. Similarly, the emitters of the transistors Q5 and Q6 are also connected to the ground line in common via a transistor Q8. The collector of the transistor Q5 is connected to the power supply line Vcc. The collector of the transistor Q6 is connected via a current source $I_1$ to the power supply line Vcc, and extends as an output terminal (not shown) via a capacitor C21.

Between the power supply line Vcc and the reference potential line, a transistor Q9 having a base connected to a base of the transistor Q7 is arranged such that a resistor R2 is positioned between Vcc and the transistor Q9. A transistor Q10 having a base connected to the base of the transistor Q8 is connected to the power supply line Vcc and the ground line via an output transistor Q11 and a resistor R3. The transistors Q7–Q10 are provided to change the gain.

The transistors Q3 and Q7 constitute a current control section 36. The transistors Q1–Q4 and the resistors R1a and R1b constitute a voltage-current conversion section 38.

A positive input terminal of the comparator 54 supplied with a control voltage Vc is connected to an emitter of a transistor Q21 and a current source $I_{11}$, and a negative input terminal of the comparator 54 is connected to an emitter of a transistor Q23. An output terminal of the comparator 54 is connected to a capacitor C31 and a base of a transistor Q22.

A positive input terminal of the comparator 56 supplied with the control voltage Vc is connected to an emitter of a transistor Q22 and a current source $I_{12}$, and a negative input terminal of the comparator 56 is connected to a connection point of resistors R11 and R12. An output terminal of the comparator 56 is connected to an output terminal OUT, a capacitor C32 and a base of a transistor Q23.

An emitter of the transistor Q23 is connected to an emitter of a transistor Q24 via the resistors R11 and R12 connected in series. The emitters of the transistors Q23 and Q24 are connected to current sources $I_{13}$ and $I_{14}$, respectively. A base of the transistor Q24 is connected to a base of the transistor Q21 via a power supply Vss.

With such a constitution, when a signal $V_B$ is input into the circuit, the output of the band pass filter is obtained from the output terminal OUT.

According to the embodiment as described above, the automatic compensation of the filter can be performed to be free from the influence of the variation of the resistance and capacitance values, by providing to an IC a time constant circuit therein, without providing any frequency discriminator.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A filter time constant automatic compensation circuit for automatically compensating a time constant of a filter in response to a control signal, the filter having a first resistive element determining the time constant of the filter, comprising:

a band pass filter having a time constant varied in response to the control signal, the band pass filter including a second resistive element determining the time constant of the band pass filter;

a feedback amplifier section configured to provide positive feedback to supply an output signal of the band pass filter to an input terminal of the band pass filter so as to generate an oscillation output signal;

a phase detector circuit configured to compare a phase of the oscillation output of the band pass filter with a phase of a reference frequency signal, and to generate a phase detection output signal corresponding to a phase difference therebetween; and a compensation circuit configured to compensate the phase detection output signal obtained by the phase detector circuit, the compensation circuit including a voltage comparison circuit for compensating the phase detection output signal to generate the control signal, the voltage compensation circuit comparing a first voltage obtained across a first voltage generation resistor and a second voltage obtained across a second voltage generation resistor, the first voltage generation resistor having the same construction as those of the first resistive element and the second resistive element, and the second voltage generation resistor having a high precision in comparison with those of the first voltage generation resistor, first resistive element, and second resistive element, wherein the time constant of the band pass filter is controlled with use of the control signal generated by the compensation circuit, and the time constant of the filter is compensated with use of the control signal generated by the compensation circuit.

2. The filter time constant automatic compensation circuit according to claim 1, wherein the second voltage generation resistor of the compensation circuit is constituted of a trimmer resistor.

3. The filter time constant automatic compensation circuit according to claim 1, wherein each of the band pass filter and the filter has a voltage-current conversion section which obtains a current signal in response to an input voltage signal and a current control section configured to obtain an output current in response to the control signal supplied from the compensation circuit.

4. The filter time constant automatic compensation circuit according to claim 1, wherein each of the filter and the band pass filter has a Gilbert cell section of the same constitution.

5. A filter time constant automatic compensation circuit for automatically compensating a time constant of a filter in response to a control signal, the filter having a first resistive element determining the time constant of the filter, comprising:

a band pass filter having a time constant varied in response to the control signal, the band pass filter including a second resistive element determining the time constant of the band pass filter, the band pass filter being supplied with a reference frequency signal thereto;

a phase detector circuit configured to receive an output of the band pass filter to compare a phase thereof with a phase of the reference frequency signal, and to generate a phase detection output signal corresponding to a phase difference therebetween; and a compensation circuit configured to compensate the phase detection output signal obtained by the phase detector circuit, the compensation circuit including a voltage comparison circuit configured to compensate the phase detection output signal to generate the control signal, the voltage comparison circuit comparing a first voltage obtained across a first voltage generation resistor and a second voltage obtained across a second voltage generation resistor, the first voltage generation resistor having the same construction as those of the first resistive element and the second resistive element, and the second voltage generation resistor having a high precision in comparison with those of the first voltage generation resistor, first resistive element and second resistive element, wherein the time constant of the band pass filter is controlled with use of the control signal generated by the compensation circuit, and the time constant of the filter is compensated with use of the control signal generated by the compensation circuit.

6. The filter time constant automatic compensation circuit according to claim 5, wherein the second voltage generation resistor of the compensation circuit comprises a trimmer resistor.

7. The filter time constant automatic compensation circuit according to claim 5, wherein each of the band pass filter and the filter has a voltage-current conversion section configured to obtain a current signal in response to an input voltage signal and a current control section configured to obtain an output current in response to the control signal supplied from the compensation circuit.

8. The filter time constant automatic compensation circuit according to claim 5, wherein each of the filter and the band pass filter has Gilbert cell sections of the same constitution.

9. A time constant variable circuit comprising:

a filter having a time constant controlled in response to a control signal, the filter having a first resistive element determining the time constant of the filter;

a band pass filter having a time constant varied in response to the control signal, the band pass filter including a second resistive element determining the time constant of the band pass filter, and being supplied with a reference frequency signal thereto;

a phase detector circuit configured to receive an output of the band pass filter to compare a phase thereof with a phase of the reference frequency signal, and to generate a phase detection output signal corresponding to a phase difference therebetween; and a compensation circuit configured to compensate the phase detection output signal obtained by the phase detector circuit, the compensation circuit including a voltage comparison circuit configured to compare the phase detection output signal to generate the control signal, the voltage comparison circuit comparing a first voltage obtained across a first voltage generation resistor and a second voltage obtained across a second voltage generation resistor, the first voltage generation resistor having the same construction as those of the first resistive element and the second resistive element, and the second voltage generation resistor having a high precision in comparison with those of the first voltage generation resistor, first resistive element and second resistive element;

wherein the time constant of the band pass filter is controlled with use of the control signal generated by the compensation circuit, and the time constant of the filter is compensated with use of the control signal generated by the compensation circuit.

10. The filter time constant automatic compensation circuit according to claim 9, wherein the second voltage generation resistor of the compensation circuit comprises a trimmer resistor.

11. The filter time constant automatic compensation circuit according to claim 9, wherein each of the band pass filter and the filter has a voltage-current conversion section configured to obtain a current signal in response to an input voltage signal, and a current control section configured to obtain an output current in response to the control signal supplied from the compensation circuit.

12. The time constant variable circuit according to claim 9, wherein the band pass filter is the same as the filter at least in constitutions of a voltage-current conversion section and a current control section.

13. The time constant variable circuit according to claim 12, wherein each of the filter and the band pass filter has a Gilbert cell section having the same constitution.

* * * * *